United States Patent
Engl et al.

(10) Patent No.: US 8,643,034 B2
(45) Date of Patent: Feb. 4, 2014

(54) MONOLITHIC, OPTOELECTRONIC SEMICONDUCTOR BODY AND METHOD FOR THE PRODUCTION THEREOF

(75) Inventors: Karl Engl, Niedergebraching (DE); Frank Singer, Regenstauf (DE); Patrick Rode, Regensburg (DE); Lutz Hoeppel, Alteglofsheim (DE); Martin Strassburg, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 394 days.

(21) Appl. No.: 12/920,317

(22) PCT Filed: Feb. 25, 2009

(86) PCT No.: PCT/DE2009/000267
§ 371 (c)(1),
(2), (4) Date: Jan. 17, 2001

(87) PCT Pub. No.: WO2009/106063
PCT Pub. Date: Sep. 3, 2009

(65) Prior Publication Data
US 2011/0101390 A1    May 5, 2011

(30) Foreign Application Priority Data

Feb. 29, 2008 (DE) .................. 10 2008 011 848
Mar. 31, 2008 (DE) .................. 10 2008 016 525

(51) Int. Cl.
*H01L 29/207* (2006.01)
(52) U.S. Cl.
USPC ........ 257/93; 257/446; 257/501; 257/E29.02; 438/222

(58) Field of Classification Search
USPC .............. 257/93, 446, 501, E29.02; 438/222
See application file for complete search history.

(56) References Cited

U.S. PATENT DOCUMENTS

| 5,684,309 | A | 11/1997 | McIntosh et al. |
| 5,831,277 | A | 11/1998 | Razeghi |
| 5,952,681 | A | 9/1999 | Chen |

(Continued)

FOREIGN PATENT DOCUMENTS

| DE | 10 2005 007601 | 9/2005 |
| DE | 10 2005 016845 | 11/2005 |

(Continued)

OTHER PUBLICATIONS

Schnitzer et al., "30% external quantum efficiency from surface textured, thin-film light-emitting diodes", Appl. Phys. Lett. 63 (16), Oct. 18, 1993, pp. 2174-2176.

*Primary Examiner* — Dale E Page
(74) *Attorney, Agent, or Firm* — Cozen O'Connor

(57) ABSTRACT

An optoelectronic semiconductor body comprises a semiconductor layer sequence which is subdivided into at least two electrically isolated subsegments. The semiconductor layer sequence has an active layer in each subarea. Furthermore, at least three electrical contact pads are provided. A first line level makes contact with a first of the at least two subsegments and with the first contact pad. A second line level makes contact with the second of the at least two subsegments and with a second contact pad. A third line level connects the two subsegments to one another and makes contact with the third contact pad. Furthermore, the line levels are each arranged opposite a first main face, wherein the first main face is intended to emit electromagnetic radiation that is produced.

14 Claims, 12 Drawing Sheets

(56) References Cited

U.S. PATENT DOCUMENTS

| | | |
|---|---|---|
| 6,111,272 A | 8/2000 | Heinen |
| 6,172,382 B1 | 1/2001 | Nagahama et al. |
| 6,635,902 B1 | 10/2003 | Lin |
| 2005/0035354 A1 | 2/2005 | Lin et al. |
| 2005/0224822 A1 | 10/2005 | Liu |
| 2006/0113548 A1 | 6/2006 | Chen et al. |
| 2006/0163589 A1 | 7/2006 | Fan et al. |
| 2007/0090377 A1 | 4/2007 | Lin et al. |
| 2007/0131958 A1 | 6/2007 | Hsu et al. |
| 2007/0284598 A1* | 12/2007 | Shakuda et al. ............... 257/93 |
| 2008/0142780 A1 | 6/2008 | Bader et al. |
| 2009/0026972 A1 | 1/2009 | Shakuda |
| 2009/0057693 A1 | 3/2009 | Takeuchi et al. |
| 2009/0065800 A1 | 3/2009 | Wirth et al. |
| 2010/0007269 A1 | 1/2010 | Klein et al. |
| 2010/0171135 A1 | 7/2010 | Engl et al. |
| 2011/0101390 A1 | 5/2011 | Engl et al. |

FOREIGN PATENT DOCUMENTS

| | | |
|---|---|---|
| DE | 10 2006 055884 | 4/2008 |
| DE | 10 2007 019775 | 10/2008 |
| DE | 10 2007 022947 | 10/2008 |
| EP | 0 905 797 | 3/1999 |
| JP | 2002-335010 | 11/2002 |
| JP | 2004-080050 | 3/2004 |
| JP | 2006-073815 | 3/2006 |
| JP | 2007-116097 | 5/2007 |
| JP | 2007-324581 | 12/2007 |
| JP | 2008-047618 | 2/2008 |
| TW | I254469 | 5/2006 |
| WO | WO 01/39282 | 5/2001 |
| WO | WO 01/47039 | 6/2001 |
| WO | WO 02/13281 | 2/2002 |
| WO | WO 2006/061728 | 6/2006 |
| WO | WO 2006/098545 | 9/2006 |
| WO | WO 2007/072873 | 6/2007 |
| WO | WO 2008/091837 | 7/2008 |
| WO | WO 2008/131743 | 11/2008 |

* cited by examiner

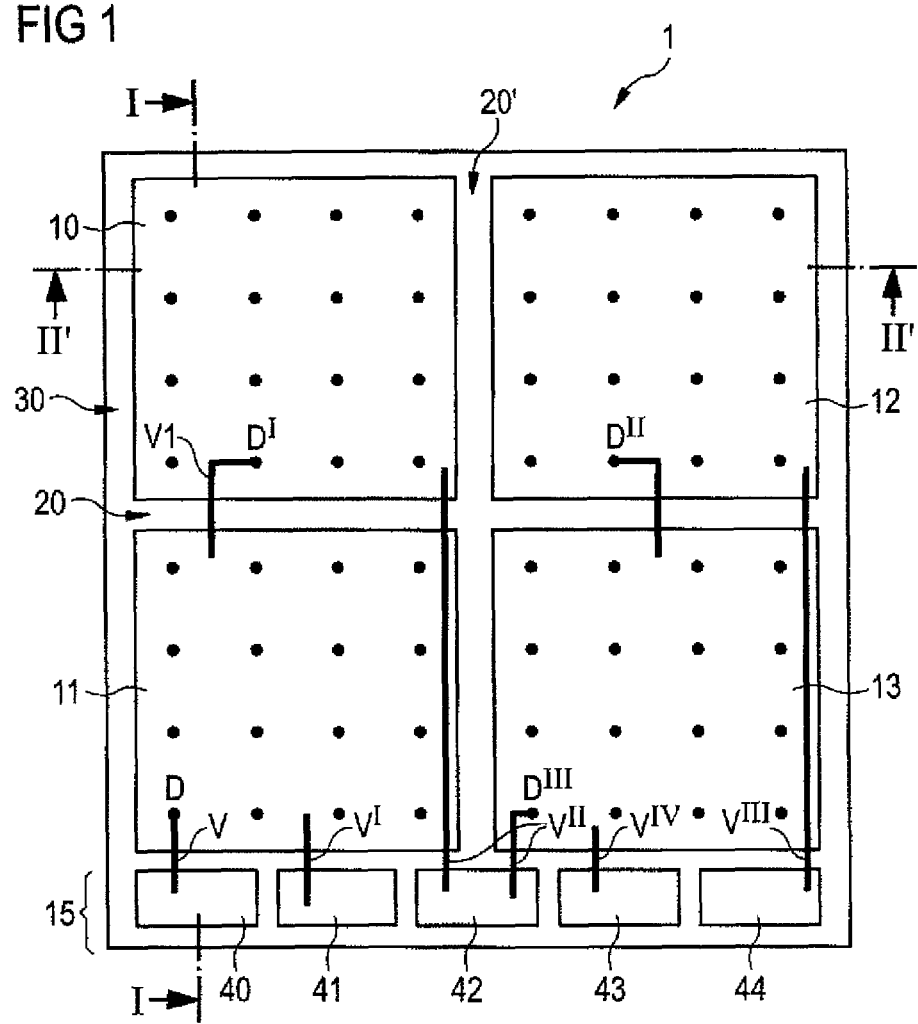

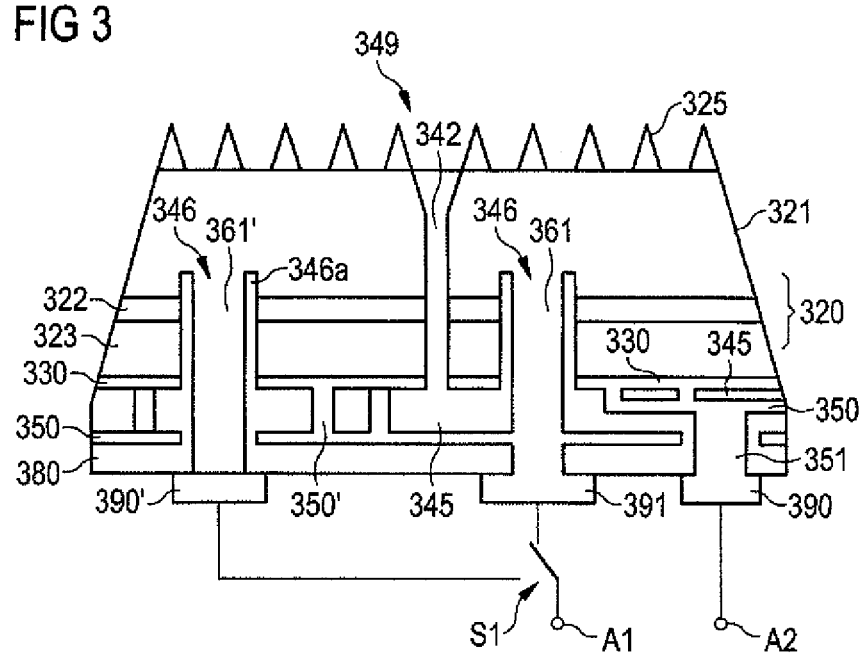

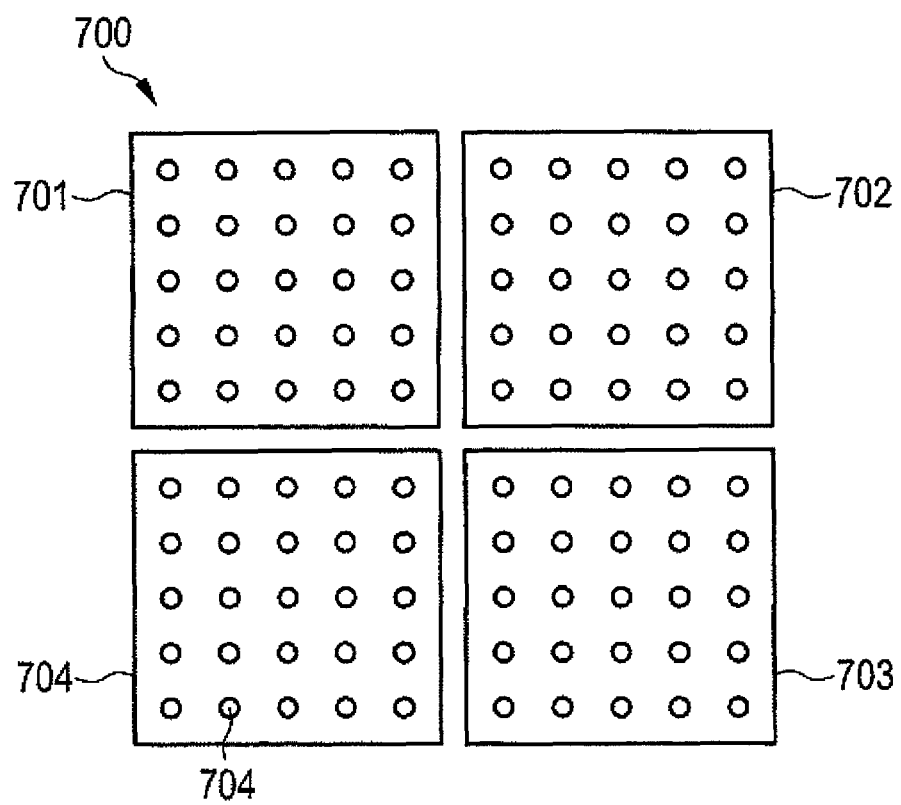

MONOLITHIC, OPTOELECTRONIC SEMICONDUCTOR BODY AND METHOD FOR THE PRODUCTION THEREOF

RELATED APPLICATIONS

This is a U.S. national stage of application No. PCT/DE2009/000267, filed on Feb. 25, 2009.

This application claims the priority of German application no. 10 2008 011 848.6 filed Feb. 29, 2008 and 10 2008 016 525.5 filed Mar. 31, 2008, the entire contents of both of which are hereby incorporated by reference.

FIELD OF THE INVENTION

The invention relates to a monolithic optoelectronic semiconductor body, and to a method for producing an optoelectronic semiconductor body.

BACKGROUND OF THE INVENTION

Optoelectronic semiconductor bodies which emit electromagnetic radiation during operation are used for a multiplicity of different light applications. Semiconductor bodies such as these can be used primarily when a high light yield is required on a small area. Examples for the use of optoelectronic semiconductor bodies with a high light yield include projection applications as well as automotive fields, where they are used, inter alia, for headlights.

In light applications such as these, the aim is to ensure not only a high light yield but also light emission which is as uniform as possible. Furthermore, the optoelectronic semiconductor body is intended to be designed such that it can be scaled, thus allowing the light intensity to be variably scaled by adding or removing individual light-emitting elements.

SUMMARY OF THE INVENTION

One object of the invention is to provide an optoelectronic semiconductor body which is more efficient than conventional lighting means in terms of light yield and emission characteristic, while having greater operating flexibility at the same time.

In one exemplary embodiment, an optoelectronic semiconductor body comprises a semiconductor layer sequence which is subdivided into at least two subsegments which are electrically isolated from one another. The semiconductor layer sequence has a first main face, a second main face and, in each subarea, an active layer which is suitable for producing electromagnetic radiation. In this embodiment, the first main face of the semiconductor layer sequence is intended to emit electromagnetic radiation produced in the active layer.

The active layer may in this case have a pn junction, a double-heterostructure, a single quantum well (SQW) structure or a multi quantum well (MQW) structure for producing radiation. The term quantum well structure has no significance in terms of the dimensionality of the quantization. In general, it comprises, inter alia, quantum troughs, quantum wires, quantum areas or quantum points, and any combination of these structures. Its dimensionality can thus extend from 0 dimensions in the case of quantum points up to 3 dimensions in the case of quantum wells. Examples of multi quantum well structures are described in the documents WO 01/39282, U.S. Pat. Nos. 5,831,277, 6,172,382 and 5,684,309, the disclosure content of all of which is hereby incorporated by reference.

The optoelectronic semiconductor body furthermore comprises a first electrical contact, a second electrical contact and at least one third electrical contact. A first line level, which is arranged adjacent on the second main face, makes contact with a first of the at least two subsegments of the subdivided semiconductor layer sequence and with the first electrical contact. It therefore produces a connection between the first of the at least two subsegments and the first electrical contact. A second line level, which is arranged adjacent to the second main face, makes electrical contact with the second contact and with a second of the at least two subsegments. Finally, the optoelectronic semiconductor body has a third line level, which is arranged adjacent to the second main face. This electrically connects the first and second subsegments of the semiconductor layer sequence to one another to produce electromagnetic radiation, and, furthermore, makes contact with the third contact.

Thus, in the proposed embodiment, in addition to at least three contacts on one surface of the semiconductor body, at least two line levels are also provided, and are electrically connected to in each case one of the contents. The three line levels face away from the first main face of the semiconductor layer sequence. Furthermore, one of the at least three line levels electrically connects the first and second subsegments to one another to produce electromagnetic radiation. This results in a series circuit between the active layer of the first and second subsegments. The active layers of the two subsegments are therefore connected to one another via the third line level such that they form a series circuit. This means that, during operation, the optoelectronic semiconductor body has a considerably lower current flow, and a greater voltage is dropped across it.

Therefore, the optoelectronic semiconductor body can be fed driven by voltage, with low currents at the same time. By way of example, this makes it possible to replace complex driver stages and high-current sources by corresponding high-voltage sources, which can be used more easily. Furthermore, the additional third contact, which makes contact with the line level connecting the two subsegments, allows the respective subsegments to be operated individually. Each subsegment in the optoelectronic semiconductor body can therefore be operated individually. It is likewise possible to operate the two subsegments jointly via the series circuit that is formed. This makes it possible to vary the light yield of the optoelectronic semiconductor body.

Furthermore, if line levels are formed on the face which faces away from the first main face, this results in the emission characteristic on the first main face of the semiconductor layer sequence changing only insignificantly, because the contact and supply lines need no longer be passed over this face. The individual subsegments of the semiconductor layer sequence therefore achieve a more uniform emission characteristic.

The semiconductor body is expediently monolithic, that is to say it comprises only one body, in which all the line levels as well as active layers are integrated, and are implemented successively during production. This allows large-area production over the entire wafer, including the formation of active layers and of the line levels on a common substrate.

In one refinement, the semiconductor body is a thin-film light-emitting diode chip. In particular, it has a mount substrate on its rear face. In one refinement, the various line levels are arranged at least in places between the semiconductor layer sequence and the mount substrate.

A thin-film light-emitting diode chip is distinguished by at least one of the following characteristic features:

a reflective layer is applied or formed on a main surface of the radiation-producing semiconductor layer sequence, which main surface faces a mount element, in particular the mount substrate, and the semiconductor layer sequence is, in particular, an epitaxial layer sequence which produces radiation, and the reflective layer reflects back into the semiconductor layer sequence at least a portion of the electromagnetic radiation produced therein;

the thin-film light-emitting diode chip has a mount element which is not the growth substrate on which the semiconductor layer sequence was grown epitaxially, but is a separate mount element which was retrospectively attached to the semiconductor layer sequence;

the semiconductor layer sequence has a thickness in the region of 20 µm or less, in particular in the region of 10 µm or less;

the semiconductor layer sequence is free of a growth substrate. In the present case, "free of a growth substrate" means that a growth substrate which may be used for growth is removed from the semiconductor layer sequence, or is at least greatly thinned. In particular, it is thinned such that it is not self-supporting in its own right or together with the epitaxial layer sequence. The remaining residue of the greatly thinned growth substrate is, in particular, unsuitable as such for the function of a growth substrate; and the semiconductor layer sequence contains at least one semiconductor layer with at least one surface which has a thorough-mixing structure which, in the ideal, leads to approximately ergodic distribution of the light in the semiconductor layer sequence, that is to say it has a scattering behavior which is as ergodically stochastic as possible.

One fundamental principle of a thin-film light-emitting diode chip is, for example, described in the document I. Schnitzer et al., Appl. Phys. Lett. 63 (16) Oct. 18, 1993, pages 2174-2176, the disclosure content of which is to this extent hereby included by back-reference. Examples of thin-film light-emitting diode chips are described in the documents EP 0905797 A2 and WO 02/13281 A1, whose disclosure content is therefore likewise to this extent included by back-reference.

To a good approximation, a thin-film light-emitting diode chip is a Lambert surface emitter and is therefore highly suitable, for example, for use in a headlight, for example a motor vehicle headlight.

In one development, the optoelectronic semiconductor body has a first sublayer in its first subsegment and a second sublayer, which is separated by the active layer. The at least one second subsegment likewise has a first sublayer and a second sublayer which is separated by the active layer. The third line level is now designed such that it electrically conductively connects the first sublayer of the first subsegment and the second sublayer of the second subsegment to one another. By way of example, an n-doped sublayer of the first subsegment is therefore electrically conductively connected by means of the third line level to a p-doped sublayer of the second subsegment. This results in the two active sublayers forming a series circuit.

For this purpose, at least one of the subsegments may have an aperture, which runs through the active layer of the subsegment and makes contact with that sublayer of the subsegment which faces the first main face. This aperture may be cylindrical, round, or else may be in the form of a trench, or may have any other desired geometric shape. The use of the plurality of apertures within the subsegment makes it possible to achieve a better lateral current distribution in that sublayer of the subsegment which faces the first main face. This further improves the emission characteristic and the light yield.

In another embodiment, the optoelectronic semiconductor body has a trench which can be filled with an insulating material. The trench may run substantially at right angles to the active layer of the respective subsegments, and may isolate the first subsegment from the at least one second subsegment. The width of the trenches may be in the region of a few micrometers. The trench preferably passes through at least that area of the active layer of the respective subsegments in which the charge carrier is recombined and therefore electromagnetic radiation is produced.

Alternatively, the trench can run vertically through a large area of the semiconductor layer sequence, thus also subdividing the semiconductor layer sequence into the respective subsegments. In this embodiment, leakage currents between the individual subsegments are reduced. Furthermore, the trench can also pass vertically through at least one of the respective line levels, and can cut through them.

The light-emitting first main face of the semiconductor layer sequence and of the electronic semiconductor body advantageously has no electrical contact surfaces. This reduces shading and absorption of a portion of the electromagnetic radiation emitted from the active sublayer during operation, through the contact points.

In another refinement of the invention, contact pads are formed alongside the radiation-emitting area, adjacent to the first main face of the semiconductor body. In this embodiment, the optoelectronic semiconductor body comprises an outer area, which is electrically isolated from the at least two subsegments and is arranged adjacent to at least one of the at least two subsegments. This outer area has a contact pad comprising the first, second and third contacts on a face which faces the first main face. The contact pad is electrically connected to the respective line level.

In a further refinement, at least one line level can be formed with a conductive mirror layer, such that electromagnetic radiation which is emitted from the active layer in the direction of the second main face is reflected in the direction of the first main face. This further improves the emission characteristic.

In another development, a mirror layer is arranged at least in places between the semiconductor layer sequence and the individual line levels, as well as the corresponding contacts of the line levels with the semiconductor layer sequence. This mirror layer may be semiconductive or else electrically isolating. In the latter case, it can have a plurality of openings through which the line levels make electrical contact with the semiconductor layer sequence in the respective subsegments. Furthermore, the mirror layer may be used as a lateral current distribution layer, in order to improve the current input into the semiconductor layer sequence. For example, for this purpose, a current widening layer may comprise a conductive oxide. Furthermore, as a mirror layer, it may be formed, for example, with silver, therefore also having good reflection characteristics, in addition to a low lateral resistance.

In one development, the active layer of the semiconductor layer sequence is formed by a plurality of active sublayers stacked one on top of the other. For example, the active layer may contain a double-hetero structure or a multi quantum well. Furthermore, it is possible to provide different active layers in each subarea of the semiconductor layer sequence. These may be doped differently, or else may contain different materials, as a result of which electromagnetic radiation at a different wavelength is emitted when charge carriers recombine.

The first main face of the semiconductor layer sequence may be structured in order to improve the emission. It is likewise possible to apply an additional conversion material to the first main face in order in this way to convert the emitted electromagnetic radiation to a second radiation at a different wavelength. This makes it possible to produce different color impressions, and to produce mixed colors as well. An appropriately suitable conversion material as well as specific material systems for the active layer of the two subsegments of the semiconductor layer sequence make it possible to produce white light, for example for headlights or for projection systems.

The individual subsegments of the semiconductor layer sequence may be arranged over an area alongside one another. For example, they may be arranged in an x·x matrix to form a square, where x is a natural number >2. Alternatively, they can also be used to form a rectangular structure, for example in the form of an x·y matrix. Thus, in both cases, the matrix is manufactured from the subsegments as a semiconductor body on a common mount.

Operation by means of the contact level with the various line levels on the face of the semiconductor layer sequence which faces away from the first main face is not restricted to two subsegments. A plurality of subsegments can be connected to one another by appropriate additional line levels, in order to form a series circuit. Individual subsegments of the semiconductor layer sequence can be operated selectively by means of additional contact elements which make contact with the individual line levels. A connection can be made externally by means of a microprocessor or some other integrated circuit. This may also include the required driver stages.

A further aspect of the invention relates to a method for producing an optoelectronic semiconductor body. In this method, a semiconductor layer sequence is grown epitaxially on a growth substrate, wherein the semiconductor layer sequence has an active layer which is suitable for producing electromagnetic radiation. Furthermore, a first subsegment and at least one second subarea, which is electrically isolated therefrom, of the semiconductor layer sequence are defined, which are intended to emit electromagnetic radiation in the direction of a first main face.

A first line level is formed adjacent to a face of the semiconductor layer sequence which faces away from the first main face, such that it makes contact with the active layer of the first subsegment. A second line level is formed adjacent to the face of the semiconductor layer sequence which faces away from the first main face, and makes contact with the active layer of the at least one second subsegment.

Finally, at least one third line level is formed on the face of the semiconductor layer sequence which faces away from the first main face. This makes contact with the active layer of the first subsegment and with the active layer of the at least one second subsegment. Furthermore, the third line level couples the active layers of the at least two subsegments to one another, forming a series circuit.

Furthermore, the method according to an embodiment of the invention includes formation of a first contact point which is connected to the first line level, formation of a second contact point which is connected to the second line level, and formation of at least one third contact point which is connected to the at least one third line level.

In the proposed method, a semiconductor body is formed whose two subsegments each have an active layer for producing and emitting electromagnetic radiation. Individual operation of the active layer of the respective subsegments is achieved by means of the line levels which are arranged on the opposite face to the first main face of the semiconductor layer sequence and which, when combined, form a contact level. The additional third line level, with the connection both to the third contact point and to the active layers of the two subsegments of the semiconductor layer sequence, allows selective operation of one subsegment in each case as well as joint operation of both subsegments, by means of the series circuit of the two subsegments that is formed by the third line level.

In one refinement of the invention, in addition to the semiconductor layer sequence, a mirror layer is also grown on a face of the semiconductor layer sequence which faces away from the first main face. This mirror layer can be formed by an electrically isolating material. Alternatively, a conductive material is also possible, in which an additional isolating intermediate layer may be provided, for electrical decoupling, between the mirror layer and the semiconductor layer sequence. In one alternative refinement, at least one of the three line levels is formed with a corresponding mirror layer. For example, the line levels can be formed by a highly reflective metal.

In one embodiment of the method according to the invention, a mirror layer is applied additionally or in the form of the line levels on that face of the semiconductor layer sequence which faces away from the first main face, so that at least 50% of the area of the semiconductor layer sequence is mirrored on the face which faces away from the first main face. The reflection capability of a mirror layer such as this may be greater than 50%, and in particular in the range between 50 and 99.9%.

After provision of a growth substrate, the epitaxial growth takes place by growing a first sublayer of a first dopant type and by subsequently growing a second sublayer of a second dopant type on the first sublayer. The active layer is formed by the different dopant types between the first and the second sublayers, and represents a so-called pn-junction. In this case, the first sublayer, that is to say the sublayer which is adjacent to the first main face, may be an n-doped sublayer. The second sublayer which faces away from the first main face is accordingly p-doped.

In addition, current widening layers may be formed on the sublayers, which have a particularly low lateral surface resistance. The line levels expediently make contact with the current widening layers. For example, after a second sublayer has been grown on the first sublayer, a current widening layer can be formed on the second sublayer, with which contact is made through at least the at least one third line level. In one embodiment of the method according to the invention, the current widening layer may additionally be formed by a mirrored layer.

First, second and third line levels are isolated from one another by appropriate insulation layers. In one exemplary embodiment, the method comprises growth of line levels, and subsequent structuring thereof. Insulating materials are then applied to the structured line level. An insulating material can likewise also be grown on the semiconductor layer sequence, and the insulating material can then be structured.

In one development of the proposed method, apertures are formed through the active layer in at least one of the at least two subsegments in order to form at least one of the first, second and at least one third line levels. The side walls of the aperture are provided with an insulating material, in order to prevent shorting. This can be done by way of example by deposition of an insulating material on the side walls of the aperture. Alternatively, the side walls of the aperture can also be oxidized, in order to form an insulation layer. The aperture is then filled with a conductive material, which makes contact with the at least one of the line levels. Contact is in this way made through the line levels with sublayers which face the first main face of the semiconductor layer sequence.

In a further embodiment, the first, second and third contact points are manufactured at the same time as the formation of the line levels which are connected to the contact points. In other words, a subarea of the semiconductor body is therefore defined, and the line level is formed thereon. This subarea will later form the corresponding contact point, and will be directly connected to the line level.

In order to refine the method further, after the epitaxial growth on the growth substrate, and in particular after the production of the contact-making level, with the individual line levels, the growth substrate is removed. The layer sequence that has been produced in this way is then applied to a mount substrate. This is done such that the mount substrate is adjacent to the third line level. The growth substrate can be removed by appropriate "blowing off" by means of a laser.

In one development of the method, the previously defined subsegments are then electrically isolated from one another by a selective isolation process. By way of example, the isolation process can be carried out using a chemical etching process, in which trenches are etched along the separating line between the respective previously defined subsegments. This trench extends through the layer sequence as far as the contact level. The trench can be filled with an electrically insulating material, but can also be exposed.

BRIEF DESCRIPTION OF THE DRAWINGS

FIG. 1 shows a schematic plan view of a first embodiment of an optoelectronic semiconductor body according to the invention, FIG. 3 shows a cross-sectional illustration of a second embodiment with contacts arranged on the rear face, FIGS. 4A, 42 show schematic section illustrations according to a third embodiment, FIGS. 7A to 7J show schematic plan views of the first embodiment of the optoelectronic semiconductor body in various stages of the production process.

DETAILED DESCRIPTION OF THE DRAWINGS

In principle, the ratios between the sizes of the illustrated elements should not be considered as being to scale in the various exemplary embodiments. In fact, individual elements such as layers may be illustrated with the size and/or thickness exaggerated, in order to assist understanding and/or in order to allow them to be illustrated better. Components having the same effect and having the same function are annotated with the same reference signs within the figures.

All of the embodiments described here as well as the production methods relate to a monolithic component. The term monolithic means production in which individual layers are not produced separately from one another. In fact, deposition or formation of layers takes place on a layer produced in a previous process step, irrespective of what function they carry out. This results in the production of a semiconductor body, in successive steps.

Figure 5:
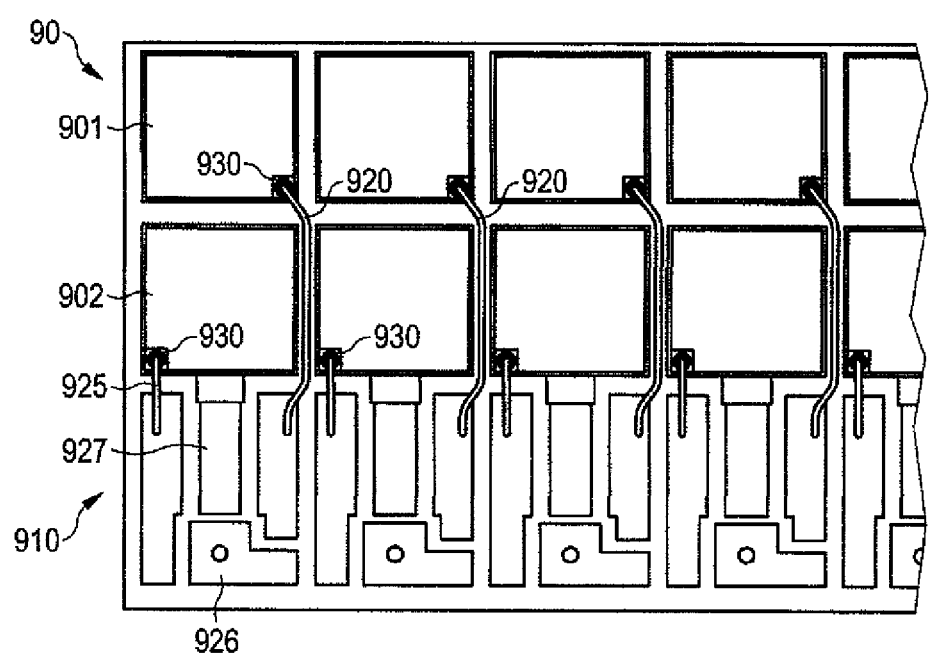
FIG. 5 shows one embodiment of an optoelectronic semiconductor body in a light application.

FIG. 5 shows one exemplary embodiment of a monolithic optoelectronic semiconductor body having individual subsegments arranged in a 2·x matrix, used as a headlight. The figure shows 2·4 complete segments, with the arrangement being continued to the right. In the embodiment, various subsegments 901, 902 are provided in an essentially square form. During operation of the circuit, these each emit electromagnetic radiation at one wavelength. The beam intensity of the light system can be controlled selectively by operating the individual subsegments 901, 902.

In order to make contact, each subsegment 901 and 902 has a polygonal outer area 930, which is provided with a contact pad. The contact pad is passed via a bonding wire 920 or 925 to a contact panel in an outer area 910. The bonding wires 920 and 925 connect the respective contact panel via the contact pad to the n-doped layer in the respective subsegment 901, 902. Two further contact panels 926, 927 are provided in the outer area 910 in order to make contact with the p-doped sublayers in the two subsegments 901, 902.

The contact points 930 in the respective corners of the subsegments 901 and 902 result in shadowing at these points during operation of the arrangement. This results in the individual subsegments having a light emission characteristic which is not uniform, and which can also be seen very clearly when the luminous power is high. The shadowing effect is more clearly evident when the bonding wires 920 are not passed along in the isolated areas between two subsegments, as illustrated here, but overlap the segments. At the same time, in the illustrated embodiment, the relatively large intermediate areas reduce the light efficiency and yield, and increase the space required for implementation.

In contrast, FIG. 1 shows a schematic plan view of one embodiment of the invention. In the exemplary embodiment, a monolithic optoelectronic semiconductor body is formed, with four light-emitting subsegments 10 to 13 in the form of a 2·2 matrix. The individual subsegments are electrically isolated from one another and from an outer area 15 by isolating trenches 20, 20'. The insulation 20, 20' can be considerably thinner than the embodiment shown in FIG. 5 since it is used only for electrical isolation of the subsegments 10 to 13. Contact elements and/or bonding wires are, however, no longer passed over them.

A total of 5 contact pads 40 to 44 are arranged in the outer area 15. As will be explained in the following text, these are connected to individual line levels below the active layer of the individual subsegments 10 to 13, and make contact with them. Once again, the line levels represent the electrical contact with the respective p and n layers of the semiconductor layer sequence in the individual subsegments 10 to 13. In summary, they form a contact level, which faces away from the light-emitting main face.

The semiconductor layer sequence in the individual subsegments 10 to 13 is based on a semiconductor material system which can be doped differently, depending on the application. For example, so-called III/V compound semiconductors or else II/VI compound semiconductors can be used. In the present case, the semiconductor layer sequence 2 may have a thickness of between 5 μm and 7 μm.

A III/V compound semiconductor material has at least one element from the third group in the periodic table, for example Al, Ga, In, and one element from the fifth group in the periodic table, such as B, N, P, As. In particular, the term "III/V compound semiconductor material" includes the group of binary, ternary and quaternary compounds which contain at least one element from the third group of the periodic table and at least one element from the fifth group of the periodic table, in particular nitride and phosphide compound semiconductors. A binary, ternary or quaternary compound such as this may furthermore, for example, have one or more dopants as well as additional components. By way of example, the III/V compound semiconductor materials include nitride-III compound semiconductor material and phosphide-III compound semiconductor materials, such as GaN, GaAs, and InGaAlP. The abovementioned compound semiconductors also include the material system AlGaN/GaN.

Correspondingly, a II/VI compound semiconductor material has at least one element from the second group in the periodic table, such as Be, Mg, Ca, Sr, and one element from the sixth group in the periodic table, such as O, S, Se. In particular, a II/VI compound semiconductor material includes a binary, ternary or quaternary compound which contains at least one element from the second group in the periodic table and at least one element from the sixth group in the periodic table. A binary, ternary or quaternary compound such as this may furthermore, for example, have one or more dopants as well as additional components. The II/VI compound semiconductor materials include, for example, ZnO, ZnMgO, CdS, CnCdS, MgBeO.

Depending on the desired wavelength or the desired wavelength spectrum, one or else more of the abovementioned compounds may be provided as the material system for an optoelectronic component.

In order to make contact, the first contact pad 40 is connected via a line level, which is indicated below and in this case by the connection V, to the sublayer which faces the main face of the subsegment 11. This is represented schematically by the connection V between the contact pad 40 and the through-hole D. The contact pad 40 therefore makes contact via the line level with the n-doped sublayer of the layer sequence in the subsegment 11. Correspondingly, the contact pad 41 is electrically conductively connected via a further line level, in this case schematically by the connection V', to the p-doped sublayer of the active layer sequence in the subsegment 11. Furthermore, this line level is also intended for making contact via further apertures D' with the n-doped sublayer of the active layer sequence in the second subsegment 10.

This is indicated schematically by the connection V', which makes contact between the p-doped area of the active layer sequence in the first subsegment 11 via apertures D' and the n-doped area of the layer sequence in the second subsegment 10. An electrical connection therefore also makes contact between the contact surface 41, via the line level under the subarea 11, through to the n-doped sublayer of the active layer sequence in the second subsegment 10.

Finally, a further, third line level V" is provided, which is isolated from the other line levels in the contact-making level and runs under the active layer sequence in the subsegment 11. This connects the p-doped sublayer in the active layer sequence in the subsegment 10 to the contact pad 42. This therefore also results in a contact for the second subarea 10 with the two sublayers, specifically on the one hand via the line level V' with the contact pad 41, and via a further line level V" with the contact pad 42.

Furthermore, the contact pad 42 is connected via apertures to the n-doped sublayer of the active layer sequence in the subsegment 13. In other words, the line level V" makes contact with the p-doped sublayer in the subsegment 10 and with the n-doped sublayer of the subsegment 13 in the optoelectronic component. The contact pad 43 is electrically conductively connected via a line level represented by the connection VIV to the p-doped sublayer in the subsegment 13. At the same time, it makes contact via this line level with apertures D" in the subarea 12 of the optoelectronic component. The apertures D" connect the n-doped sublayer of the active layer sequence in the subsegment 12 on the one hand to the contact surface 43, and on the other hand via the line level to the p-doped sublayer of the active layer sequence in the subsegment 13. A final line level, which is represented schematically by the connection $V^{III}$, connects the fifth contact surface 44 to the p-doped sublayer of the active layer sequence in the subsegment 12. In the present exemplary embodiment, the line levels in the contact layers are arranged such that they overlap. However, they may also run alongside one another, depending on the application.

As a result of the arrangements of the line levels one below the other and of the individual contact surfaces and their connection to the respective line levels, selective operation of each individual subsegment 10 to 13 of the optoelectronic semiconductor component 1 is possible. Two subsegments can each likewise be combined to form a series circuit. All four subsegments can likewise be used to form a series circuit during operation. The following table illustrates the connection during operation of the optoelectronic semiconductor body, depending on the desired operating mode.

| Segments to be operated | Contacts to be connected |
| --- | --- |
| 10 | 41 with n, 42 with p |
| 11 | 40 with n, 41 with p |
| 12 | 43 with n, 44 with p |
| 13 | 42 with n, 43 with p |
| 10 and 11 | 40 with n, 42 with p |
| 12 and 13 | 42 with n, 44 with p |
| 10 to 13 | 40 with n, 44 with p |

In the table, "n" or "p" denotes the respective charge carrier type which is supplied to the contact pad. The pn-junction in the active layer of the subsegments is in each case biased in the forward direction during operation. This means that, if anything at all is applied, "n" is always applied to the contact pad 40, and "p" is always applied to the contact pad 44. The further three contact pads 41 to 43 either have a positive potential or a negative potential applied to them, depending on the desired operating mode, and are supplied with appropriate charge carriers.

If, for example, radiation emission is intended to take place just by the subsegment 10 during operation, a negative potential (corresponding to a supply of electrons) is applied to the contact pad 41, and a corresponding positive potential (corresponding to a supply of holes) is applied to the contact pad 42, in order to bias the diode in the subsegment in the forward direction. The n-doped sublayer and the p-doped sublayer are supplied with the appropriate charge carriers via the second line level $V^{II}$ via the line level, represented by the connection $V^I$ and the apertures D' provided in the subarea 10. Since, at the same time, the subarea 11 is connected in the reverse-bias direction via the contact pad 41, it does not emit any radiation. If, in contrast, the subsegments 10 and 11 are selected to produce radiation, the appropriate voltage must be supplied to the contact pads 40 and 42, as shown in the table.

Therefore, each subsegment can be connected individually, or else two segments can be connected to one another in series in pairs, by means of the wiring level proposed here.

Figure 2A:
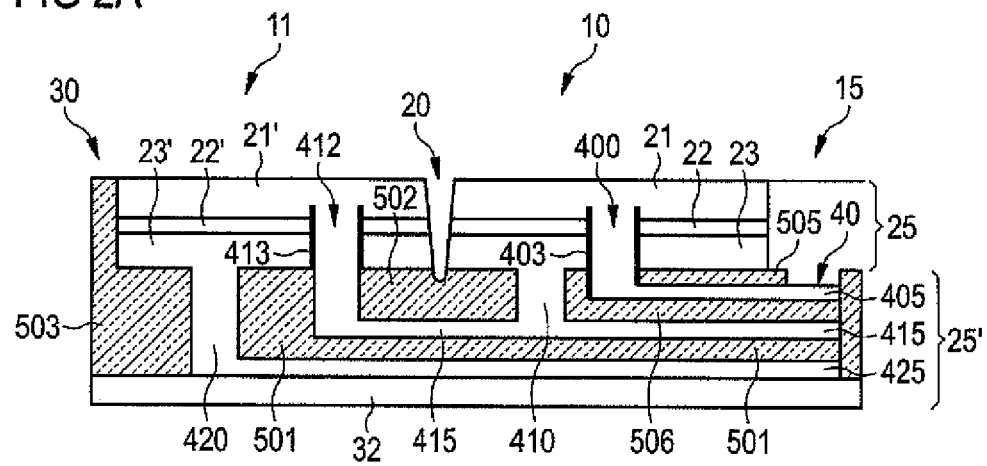
FIG. 2A shows a schematic cross-sectional view of the embodiment shown in FIG. 1, along the I-I' level.

In this context, FIG. 2A shows a cross-sectional view along the axis I-I'. The semiconductor layer sequence 25 in the optoelectronic semiconductor body is subdivided by a trench 20 into the two subsegments 10 and 11. The semiconductor layer sequence 25 comprises a first n-doped sublayer 21, which faces the emission surface, in the subsegment 10, and 21' in the subsegment 11. A further sublayer 23, 23' is p-doped and is applied on the face which faces away from the emission surface. The joint arrangement of the n-doped and p-doped sublayers 21, 21' and 23, 23' results in a first pn-junction 22 being formed in the subarea 10, and a second pn-junction 22' being formed in the subarea 11. The charge carriers are recombined in this latter pn-junction, with electromagnetic radiation being emitted. The cut-through trench 20, which passes through all the sublayers in the layer sequence 25, provides electrical isolation between the two subsegments 10 and 11, and at the same time prevents leakage currents between the two subsegments.

An aperture 400 is provided in order to make contact with the n-doped sublayer 21 in the first subsegment 10, and its side walls 403 are isolated with an electrical material. This prevents a short and a current flow into the p-doped layer 23 during operation. The aperture 400 extends from the p-doped sublayer 23 through the pn-junction 22 as far as the n-doped sublayer 21. Furthermore, the aperture 400 makes electrically conductive contact with a first line level 405. This is isolated from the p-doped sublayer 23 and from the further line levels by an isolation layer 505 or 506, respectively. The line level 405 leads, as illustrated, to the contact pad 40 which, in the present case, is formed by a subarea of the line level 405 itself. The contact pad 40 therefore makes contact with the n-doped sublayer 21 in the first subsegment 10 via the aperture 400 and the line level 405.

In the illustrated exemplary embodiment, a second line level 415 is arranged under the first line level and runs from the contact pad 41, which is no longer illustrated here, on the one hand to a contact 410 with the p-doped layer 23 and, furthermore, to further apertures 412. This is part of the second subsegment 11, and makes contact with the n-doped sublayer 21' in the layer sequence 25 in the second subsegment 11. In this case as well, the side walls are isolated via an additional isolating layer 413 from the active layer 22' and from the p-doped sublayer 23'. An isolation layer 501 is provided under the second line level 415, and for isolation from the third line level 425. In addition, the isolation 502 separates this line level from the p-doped sublayer 23' in the second subsegment 11 as well.

A third line level 425 finally connects the third contact 42, as shown in the plan view in FIG. 1, and the p-doped sublayer of the subsegment 11 via the supply line 420. The third line level is applied on an insulating substrate 32, and is surrounded by the insulation 503 and 501.

The current flow for operation of the arrangement of the individual subsegments 10 and 11 will be explained in the following text. Connected in the forward-biased direction during operation of only subsegment 10, the contact pad 40 and therefore the first line level 405 as well as the second line level 415 have an appropriate potential applied to them. The current then flows via the n-doped sublayer 22 into the p-doped sublayer 23, with the charge carriers that are supplied recombining in the pn-junction 22 in the first subsegment, emitting electromagnetic radiation.

In order to operate only the second subsegment 11, the pn-junction 22' provided there is forward-biased. This is done by supplying appropriate charge carriers in the second line level 415 and/or in the third line level 425 via the appropriate contact pads. In this operating mode, the pn-junction 22 in the first subsegment 10 is connected in the reverse-bias direction, and therefore prevents charge carrier recombination in this subarea. When both subsegments are being operated at the same time, a voltage is applied to the first line level 405 via the contact pad 40 and to the third line level 425 via the contact pad 42, which is not illustrated here, such that the two pn-junctions 22 and 22' in the two subsegments are forward-biased. Current then flows via the first line level 405 and the aperture 400 into the first pn-junction 22, and from there via the supply line 410 and the second line level 415 into the second aperture 412 in the second subsegment 11. The pn-junctions in the two subsegments are then forward-biased.

Figure 2B:
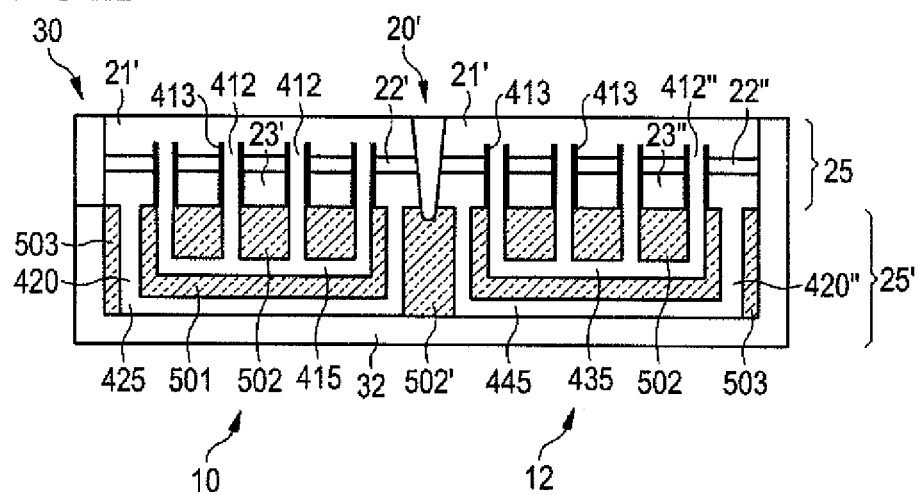
FIG. 2B shows a schematic cross-sectional view of the embodiment shown in FIG. 1, along the II-II' level.

FIG. 2B shows a cross-sectional view along the axis according to the embodiment shown in FIG. 1. The two subsegments 10 and 12 are once again isolated by an isolating trench 20', thus preventing any current flow. Furthermore, the trench 20', which is filled with an insulation material, extends into the additional isolation layer 502, which isolates the individual line levels from one another. The subsegments 10 and 12 are therefore surrounded by an isolating layer formed from the trench 20' and the isolating side areas 30.

The section view in FIG. 2B shows only the second line level 415 and the third line level 425. As can be seen from the cross-sectional illustration in FIG. 2A, there is no first line level 405 in the section illustration shown in FIG. 2B, since the line level 405 does not make direct contact with the segments 10 and 12. The n-doped sublayer 21' in the area 10 or 21'' of the subsegment 12 is provided by a plurality of apertures 412 or 412'' for both subsegments. These are each formed by trenches on whose side walls an insulation material 413 is deposited. This prevents a short and electrical contact with the p-doped sublayers 23' in the subsegment 10, and 23'' in the subsegment 12. The apertures in the contact level 25' in which the line levels run are joined together to form a common line level 415 and 415''. The p-doped sublayer 23 in the subsegment 10 is connected by the supply lines 420 to the third line level 425. Correspondingly, the apertures 420'' make contact between the sublayer 23'' of the subsegment 12 and the third line level 425''. As shown in the embodiment in FIG. 1, the third line level 425'' in the subsegment 12 leads to the contact pad 44, and the second line level 415'' in the subsegment 12 leads to the contact pad 43.

FIG. 3 shows a cross-sectional illustration of a further embodiment, in which all the contact elements are likewise arranged on the rear face. Once again, the semiconductor layer sequence 320 contains a first n-doped layer 321, adjacent to which a p-doped layer 323 is applied. As illustrated, a pn-junction 322 is formed at the interface.

By way of example, InGaN/GaN can be used as a material system for the layer sequence, and its emission spectrum is in the visible blue light range. The applied structuring 325 which is provided improves the emission characteristic of the optoelectronic semiconductor body. Furthermore, a conversion means can also be provided, and can be applied to the surface of the structuring 325. In consequence, a portion of the emitted blue light is converted to light at a different wavelength, thus making it possible to produce white light.

A conductive, reflective connecting layer 330 is arranged on the face of the second layer 323 of the semiconductor layer sequence 320 which faces away from the structuring 325. At the same time, this is also used as a lateral current widening layer for inputting charge carriers. A plurality of supply line elements 350 make contact with the layer 330 and are themselves connected by means of an aperture 351 to a contact pad 390 which is arranged on the rear face.

Furthermore, an aperture 346 is provided, which is filled with an electrically conductive material 361. The aperture 346 runs from the rear face of the semiconductor body through all the layers to the layer 321 of the semiconductor layer sequence 320. Its side walls are essentially virtually completely surrounded by an insulating material 364, in order to prevent a short, for example to the connecting layer 330. Furthermore, the contact 361 is connected to a contact pad 391 on the rear face of the optoelectronic semiconductor body and to a conductive material layer 350'. The material layer 350' makes contact with the connecting layer 330' in the left-hand subsegment of the semiconductor body. The same is electrically completely isolated from the right-hand subsegment by an isolating trench 342. The trench 342 is filled with an insulation material which also fills the intermediate spaces between the individual apertures 350' and 350. This insulating material can at the same time be used as a mount substrate for the substitute mount 380.

The conductive layer 350' together with the layer 330' forms a first connecting layer for the left-hand subsegment of the optoelectronic semiconductor body, and makes contact with the layer 323 in the semiconductor layer sequence 320. A trench 361' is correspondingly also formed in the left-hand subarea of the semiconductor body, and its side walls 346a are provided with an insulating material. The material of the trench 361' makes contact with the contact pad 390', which is located on the rear-face surface.

Externally, the contact pads 390' and 391 are coupled on the rear face to a switch S1, which leads to a first connection A1. The contact 390 is coupled to a second connection A2. During operation of the arrangement, now only the right-hand part of the optoelectronic component, or both parts of the optoelectronic component, is or are now supplied with current, depending on the switch position S1. During operation of the semiconductor arrangement in the illustrated switch position, a current flows via the contact 390 and the supply line 350 into the semiconductor layer sequence in the right-hand area of the semiconductor body. The charge carriers recombine in the pn-junction there, and emit light. During operation, the left-hand subarea of the semiconductor body is switched off in the illustrated switch position.

If the connection A1 is now coupled to the contact pad 390' via the switch S1, then the current flows via the trench 361' in the right-hand subarea of the semiconductor body into the first connecting layer from the layers 350' and 330' in the left-hand subarea of the semiconductor body. The two semiconductor layer sequences and their pn-junctions contained in them are therefore connected in series.

Depending on the configuration of the individual connecting layers and their contact in the respective subsegments, the individual subsegments of an optoelectronic semiconductor body can therefore be connected externally in parallel or in series.

The connection can be made externally via an integrated circuit. This operates the switch and, furthermore, has various driver stages, in order to supply the adequate voltage and current to the individual segments, or else the segments connected in series. In this case, care must be taken to ensure that, when connected in series, the voltage which is dropped overall across the segments will be correspondingly greater, while the current flowing through them will remain substantially the same. A voltage-driven driver stage is therefore required in this respect. The current through the individual subsegments can likewise be varied, in order to achieve a different light yield.

Figure 6:
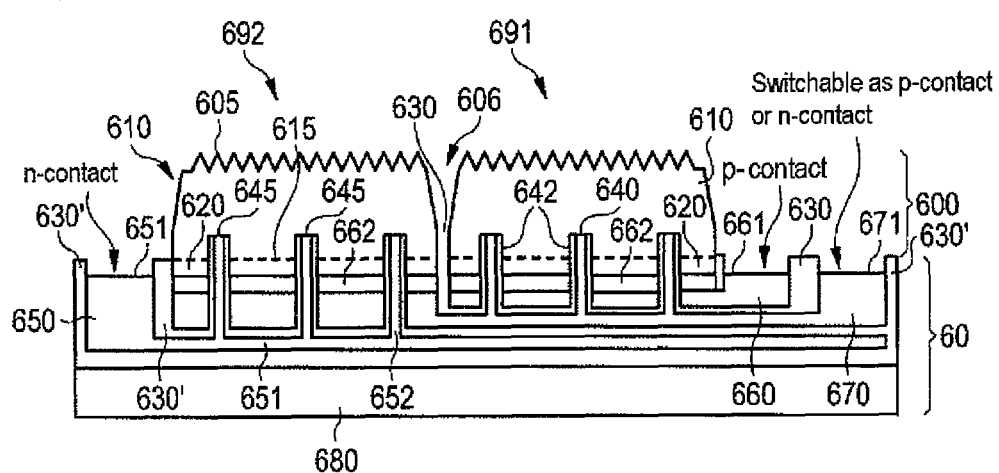
FIG. 6 shows a cross-sectional illustration of a fourth embodiment.

FIG. 6 shows a cross-sectional illustration of a further embodiment of a semiconductor body with a structured layer sequence 600, which is arranged on a contact level 601.

The layer sequence 600 is provided on its first main face with structuring 605, and is subdivided into two subsegments via a trench 606 and an insulation material 630 which cuts through the layer sequence. Each subsegment therefore comprises a layer sequence of an n-doped first sublayer 610 and a second p-doped sublayer 620 arranged underneath it. The different doping results in a pn-junction 615 being formed, which represents the active layer for production and emission of electromagnetic radiation.

The contact level 601 is arranged underneath this, and itself has different line levels. These make contact with the individual sublayers 610 and 620 in the two subsegments. In this case, as illustrated, contact pads are arranged both on the right-hand side and on the left-hand side of the semiconductor layer sequence 600. In detail, a first contact 661 is formed adjacent to the first subarea of the layer sequence on the face which faces the main face. This contact pad 661 forms the p-contact of the arrangement during operation, and is electrically conductively connected to the first line level 660.

The line level 660 makes contact with the p-doped sublayer 620 in the first subsegment 691 in the layer sequence. This is done via an electrically conductive mirror layer 662, which is arranged underneath the p-doped sublayer 620. The mirror layer 662 underneath the p-doped sublayer 620 is electrically conductively isolated from the corresponding mirror layer 662 in the second subsegment 692 by the insulation material 630. The mirror layer 662 reflects light produced in the pn-junction 615 in the direction of the first main face, and therefore toward the structuring 605.

A further conductive contact pad 671 on the upper face of the semiconductor body is isolated from the first contact 661 via the insulation material 630, and is connected to the second line level 670. The second contact 671 may be composed of the same material as the line level 670. The line level 670 makes contact with the n-doped sublayer 610 in the first subsegment 691 via a number of apertures 640. These apertures extend through the insulation layer 630, which isolates the first line level 660 from the second line level 670, through the line level 660, through the mirror layer 662, through the p-doped sublayer 620 and through the pn-junction into the sublayer 610 in the first subsegment 691. These are filled with an electrically conductive material, and the outer walls 642 are appropriately insulated. This prevents a short between the second line level and the first line level 660 and/or the mirror layer or the p-doped sublayer 620.

Furthermore, the second line level 670 also makes contact with the p-doped sublayer 620 in the second subsegment 692 via the mirror layer 662. In consequence, the n-doped sublayer 610 in the first subsegment 691 makes electrical contact with the p-doped sublayer 620 in the second subsegment 692. The pn-junctions 615 in the two subsegments 691 and 692 therefore form a series circuit.

Finally, a third contact 651 is provided adjacent to the second subarea 692 and makes contact via the third line level 650 and trenches 645 with the n-doped sublayer 610 in the second subsegment 692. In this case as well, the apertures 645 extend through the second line level 670, the mirror layer 662, the p-doped sublayer 620 and the pn-junction 615 into the n-doped sublayer 610 in the second subsegment. Insulating side walls 642 prevent a short between the third line level 650 and the second line level 670, or the mirror layer 662. Finally, the third line level 651 is isolated from a mount substrate 680 by an isolation layer 630'.

During operation of the arrangement, the contact 671 connected to the second line level 670 is in the form of a switchable contact. This means that either positive or negative charge carriers are supplied, depending on the desired operating mode. Correspondingly, it switches the corresponding pn-junction to be forward-biased or reverse-biased, depending on whether the first subsegment or the second subsegment is intended to be operated. For example, if the intention is to operate only the first subsegment 691, the contact pad 661 is used as a p-contact, and the switchable contact 671 as an n-contact.

When only the second subsegment 692 is being operated, the third contact pad 651 is operated as an n-contact, and the switchable contact 671 as a p-contact. In this operating mode, the pn-junction 615 in the first subsegment 691 is then reverse-biased. When the two subsegments are being operated in the form of a series circuit, the contact pads 661 and 651 are respectively used as the p-contact and the n-contact. In this case, the switchable contact 671 is not connected.

FIGS. 7A to 7I show plan views of a monolithic semiconductor body in various stages during its production. The production process, in particular of the contact level with the various line levels and the insulating materials arranged between them, will be explained with reference to these views.

FIG. 71A shows the plan view of the semiconductor body 700, in the present case subdivided into four subsegments 701 to 704. A trench is defined between each subsegment in order during subsequent process steps to electrically isolate the semiconductor layer sequence in each individual subsegment 701 to 704 from one another. Furthermore, the holes 701' which are provided for the n-doped sublayer are defined in each subsegment.

Figure 7B:
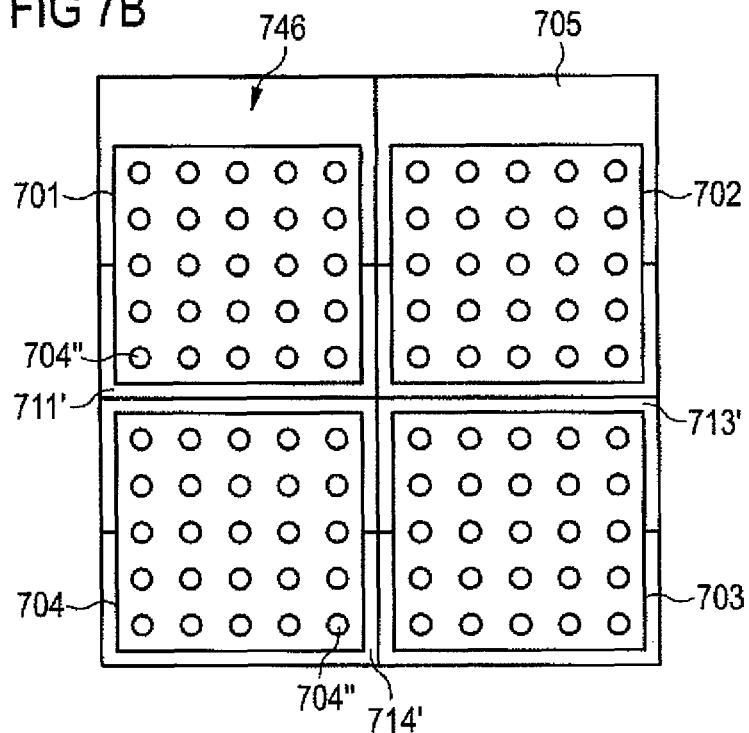

The p-doped sublayer is then applied, as shown in FIG. 7B, to the semiconductor body and to the subsegments 701 to 704, with cutouts 704" being provided in the areas of the subsequent apertures to the n-doped sublayer. Furthermore, an outer area 746 is provided, on which the subsequent contact pads will be arranged.

A further subarea 711' is provided adjacent to the first subsegment 701 between the first subsegment 701 and the fourth subsegment 704. A corresponding situation applies to the subareas 713' between the second subsegment 702 and the third subsegment 703, as well as a subarea 714', which is adjacent to the subsegment 704, between the subsegment 704 and the subsegment 703.

Figure 7C:
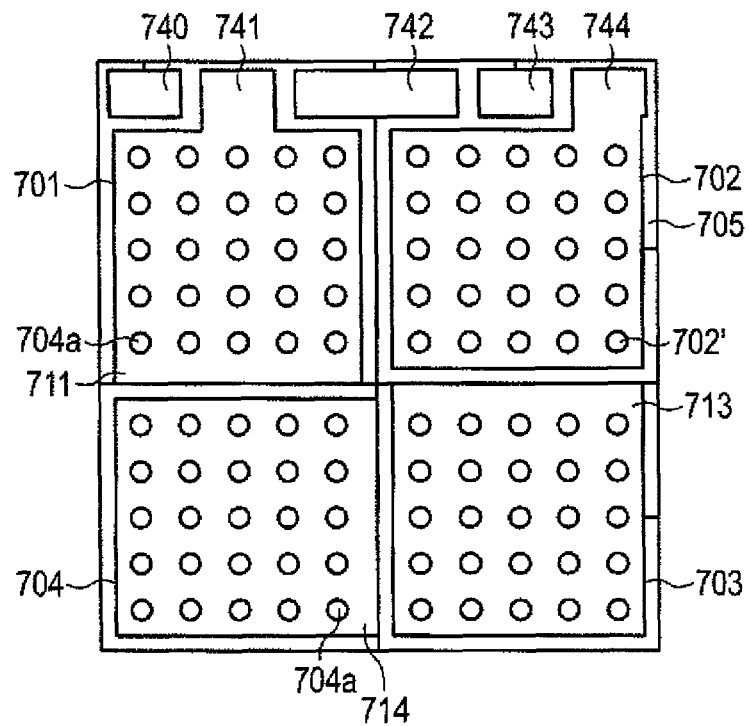

A line level is now deposited in each subsegment 701 to 704 onto the p-doped sublayer as shown in FIG. 7C. This is used for p-contact reinforcement and, as illustrated, at the same time couples some of the subsequent connecting pads to the corresponding segments.

In detail, an outer area of the contact reinforcement forms a first contact panel 741, which is connected via the corresponding line level to the p-doped sublayer of the first subarea 701. As can be seen, furthermore, the subarea 711' which is adjacent between the subareas 701 and 704 of the semiconductor body is covered by the line level. The line level over the subsegment 701 is therefore no longer rectangular in the area of the segment 701, but covers the first subsegment 701 and the additional, adjacent subarea 711.

In a corresponding manner, a line level which overlaps the additional adjacent outer area 714' is also deposited over the fourth subsegment 704. An additional subarea 714 is correspondingly formed in this area. The same applies to the additionally defined subarea 713, which is located with the line level above the p-doped sublayer of the segment 703.

Finally, a last p-contact reinforcement and last line level are arranged over the subsegment 702. This contact reinforcement 702' furthermore makes electrically conductive contact with the contact panel 744, which therefore makes contact with the p-doped sublayer of the segment 702. Furthermore, three additional contact areas 740, 742 and 743 are defined, and are provided with metallization. Isolating intermediate areas are arranged between the individual contact areas 740 to 743. Furthermore, each line level which reinforces a p-contact in the individual segments was provided with cutouts 704a in the area of the subsequent apertures.

An isolation layer is then applied to the layer sequence and to the first line levels of the individual segments.

Figure 7D:
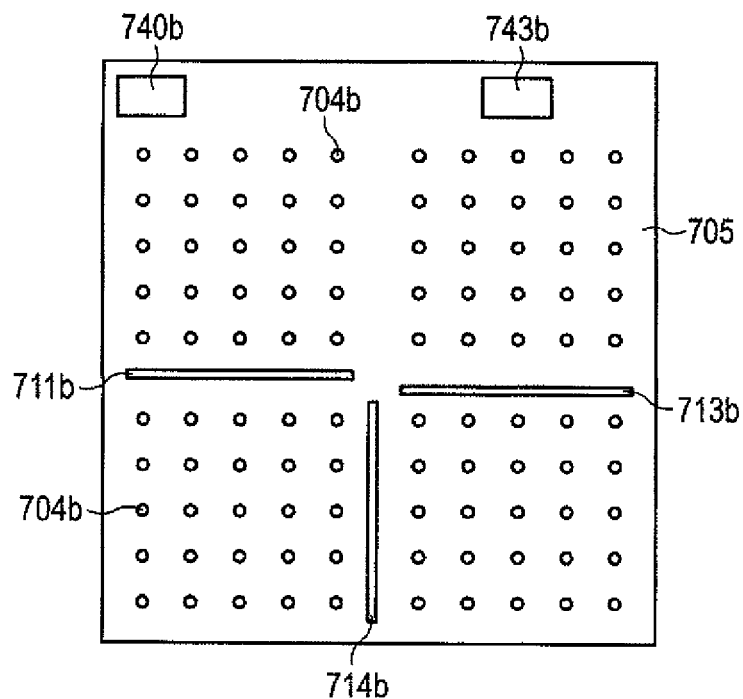

FIG. 7D shows the next process step, in which the insulating material is opened in the area of the apertures. The apertures 704b which result from this allow contact to be made later with the n-doped sublayer in the respective segments. Furthermore, the subareas over the previously defined contact areas are opened, and the metallization located underneath is exposed in order to form the contact surfaces 740b and 743b. A narrow trench 711b, 714b and 713b is likewise etched out of the insulating material, and the subareas 711, 714 and 713 located underneath are exposed.

Figure 7E:
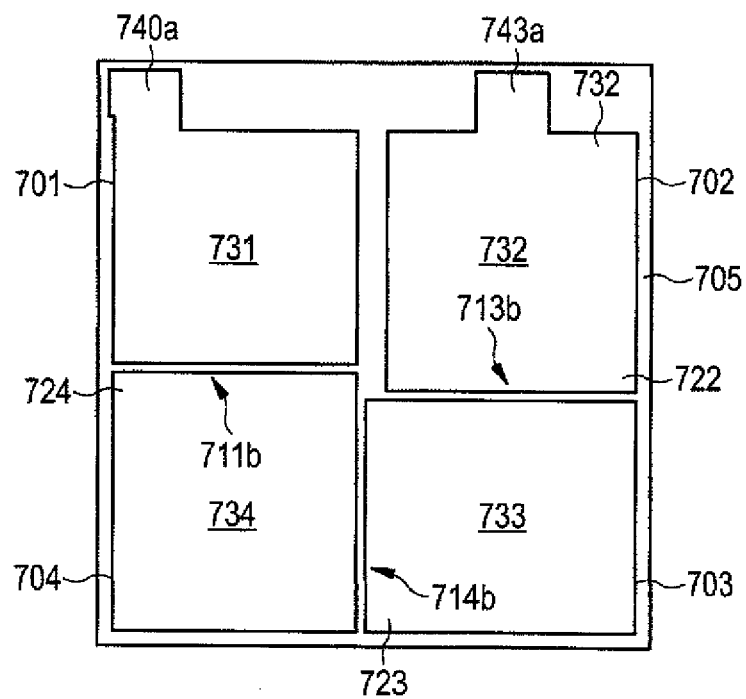

Finally, FIG. 7E shows the semiconductor body after the second line level has been applied. This can be done by depositing metallization on the layer sequence, and subsequent structuring. A corresponding conductive layer 731, 732, 733 and 734 is thus applied to each subsegment 701 to 704. In detail, the line level 731 in the first subsegment 701 is also passed out in the area 740a, as a result of which it makes contact with the contact metallization in the area 740b located underneath. Furthermore, the line level 734 is grown over the fourth subsegment 704 in a subarea 724 above the subsegment 704 such that it overlaps the aperture 711b, which is located underneath and illustrated in the previous figure, thus making contact with the p-contact-making layer exposed in the trench 711b.

The line level 733 is also grown in the same manner over the third subsegment 703 in a subarea 724 over the trench 714b located underneath. The line level 732 over the subsegment 702 correspondingly overlaps the aperture 713b in the subarea 722, and furthermore makes contact with the contact metallization 743b, located underneath, in the area 743a.

The n-contact wiring is therefore defined, and is at the same time passed out to the corresponding contact pads. In other words, the line level 732 makes contact on the one hand with the n-doped sublayer in the subsegment 702, and at the same time via the trench 713b with the p-doped sublayer in the subsegment 703. Correspondingly, the line level 733 in the subsegment 703 makes contact with the n-doped sublayer in the subsegment 703 through the apertures illustrated in the previous figures and, furthermore, via the trench 714b with the p-doped sublayer in the subsegment 704. The line level 734 in the subsegment 704 makes contact with the n-doped sublayer in the segment 704 via the corresponding apertures and, via the trench 711b, with the p-doped sublayer in the subsegment 701.

Figure 7F:
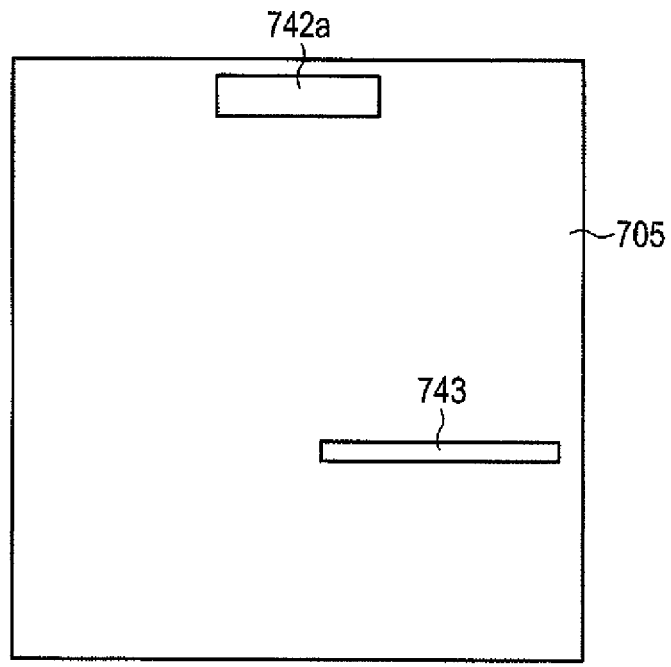

Finally, the central contact pad 742a and the separate third line level 743 are defined in FIG. 7F. For this purpose, an isolation layer is grown on the line levels 731 to 734, produced in the previous process steps, in the subsegments 701 to 704. The isolation layer is expediently grown on the entire surface of the semiconductor body, in order to also compensate for any steps which may exist. The central contact pad is defined in the area 742a in the grown isolation layer, and a corresponding aperture is defined in the area 743. The insulation material is then removed in these areas, thus, on the one hand, exposing the metallization layer, located underneath, of the contact pad 742 in the area 742a. An aperture is formed through the isolation layer in the area 743, exposing the line level 733 located underneath in the third segment 703.

Figure 7G:
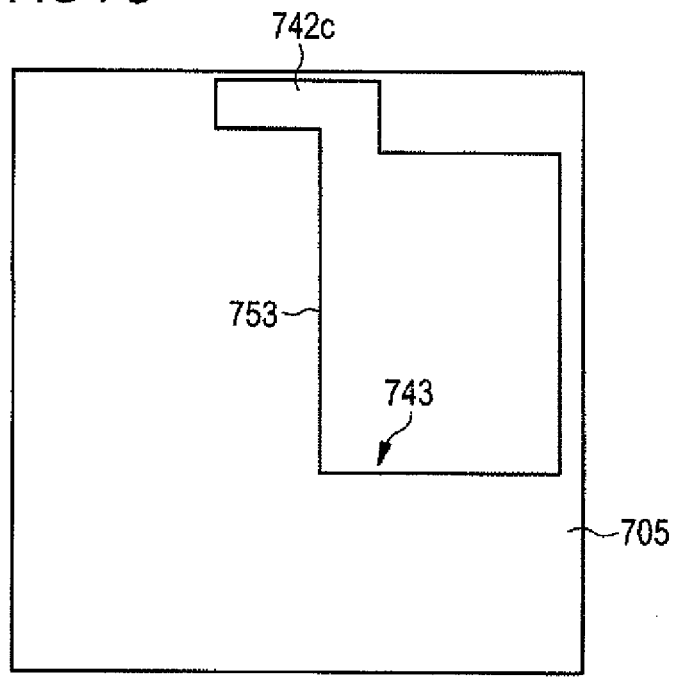

As shown in FIG. 7G, on the isolation layer over a further line level 753, the contact area 742c now makes contact with the second line level 733 in the third subsegment 703 via the aperture 743. As illustrated here, the third line level 753 is applied over an area as metallization. This is particularly expedient when steps resulting from the various wiring layers are intended to be avoided during the growth process. Alternatively, the third line level 753 may also be in the form of a simple supply line.

Figure 7H:
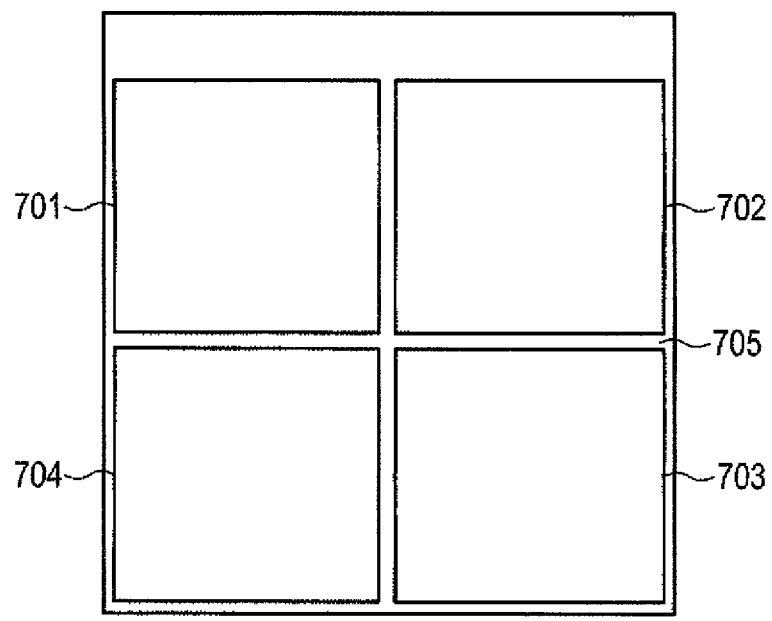

The layer sequence of the semiconductor body and the third line level are then covered over an area by an insulating layer, in order to form a uniform rear face and to compensate for any steps which may be present. Then, as shown in FIG. 7H, the existing growth substrate is removed by means of a so-called laser lift-off process. This is done by applying a laser, during which process the growth substrate is removed from the previously manufactured layer sequence. The rear face of the layer sequence is now applied to a mount substrate, as a result of which the line level formed in FIG. 7G is adjacent to the mount substrate. A wet-chemical method can also be used to remove the growth substrate.

FIG. 7H now shows the plan view of the first main face of the grown layer sequence, into which the electromagnetic radiation is intended to be emitted during subsequent operation. In a further step, the intermediate areas defined in FIG. 7A are etched as trenches, as a result of which the individual subsegments 701 to 704 of the semiconductor body 705 are electrically isolated from one another. The trench depth therefore passes at least through the two n-doped and p-doped sublayers as well as the active layer in the layer sequence. The contact level together with the individual line tracks is in contrast not cut through by the trench since, otherwise, the series circuit of the individual segments, as produced in the previous process steps, would be interrupted.

Figure 7I:
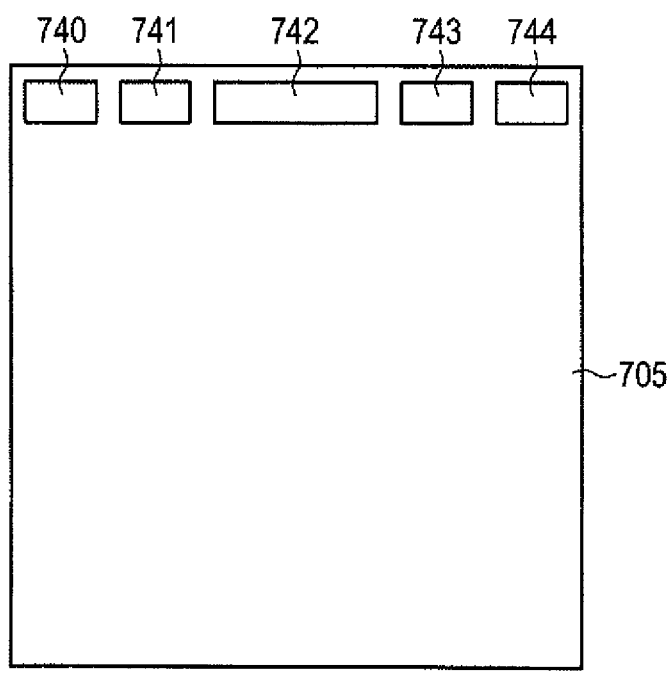

In the final process step as shown in FIG. 7I, the contact pads 740 to 744 of the semiconductor body 705 are now exposed from the front face.

Figure 7J:
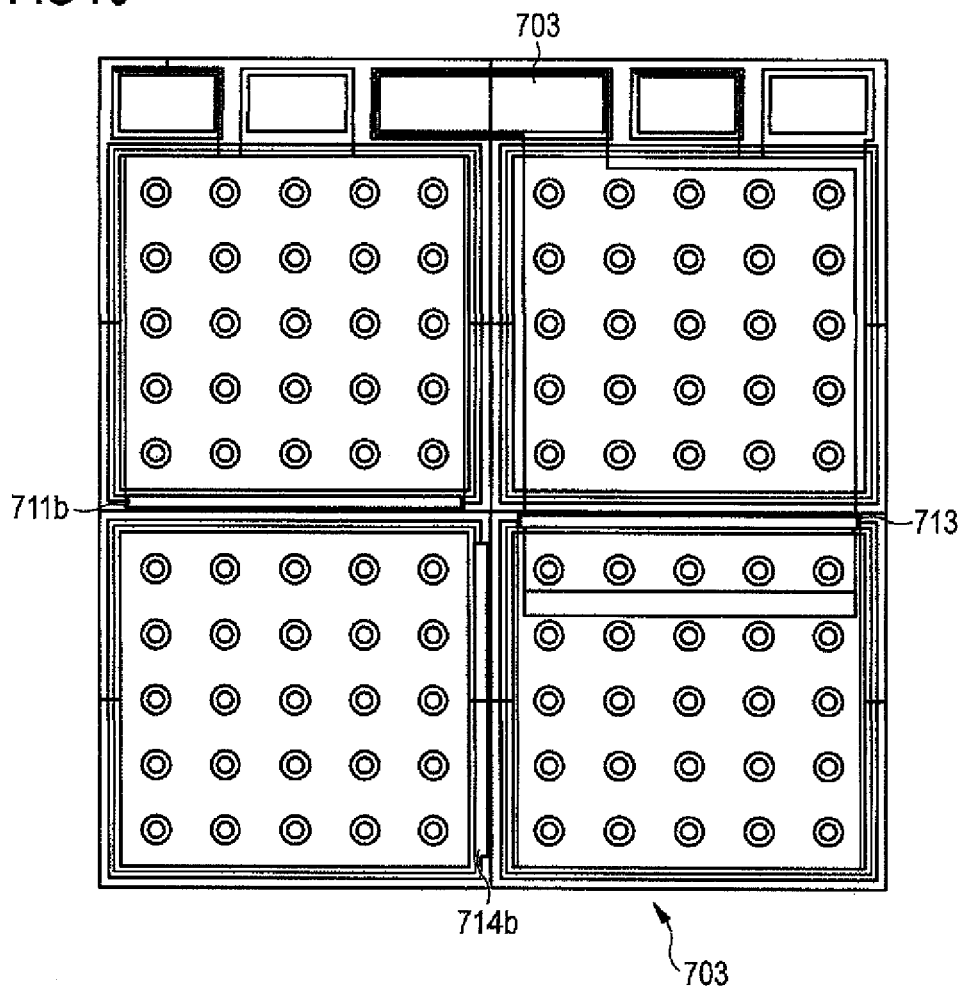

Finally, FIG. 7J schematically illustrates an overall view of the individual lithography steps. This clearly shows the various contact levels, in particular the contact level of the central contact panel 742, which connects the subsegment 703 to the contact panel 742. The corresponding subareas of the segments 703, 704 and 701 provide a series circuit comprising all four segments, thus implementing a voltage-driven light-emitting semiconductor component. The wiring on the face opposite the emission prevents shadowing of the upper face, and maximizes the light yield. At the same time, individual subsegments of the semiconductor body can be operated by driving them selectively.

The embodiment illustrated here is not restricted to a 2·2 matrix. In fact, any desired number of individual subsegments of a semiconductor body can be combined with one another, forming a series circuit or parallel circuit. Different line levels in a contact level facing away from the emission face allow the individual subsegments to be connected as appropriate for the particular application. The capability to couple segments in series reduces the current flow through the individual subsegments in the semiconductor body, thus allowing simple driver modules to be used.

Depending on the desired wiring, it is thus possible to produce different embodiments in a matrix comprising individual subsegments, of an optoelectronic semiconductor body, which produce electromagnetic radiation during operation. In this case, the individual subsegments can be manufactured as a common layer sequence. After manufacture, they are separated into subsegments by means of isolating trenches. Any desired connection of the individual subsegments can be achieved, by the application to the contact level facing away from the main face, with the individual line levels.

In this context, FIGS. 4A to 4F show a schematic illustration of a further embodiment of the invention.

Figure 4B:
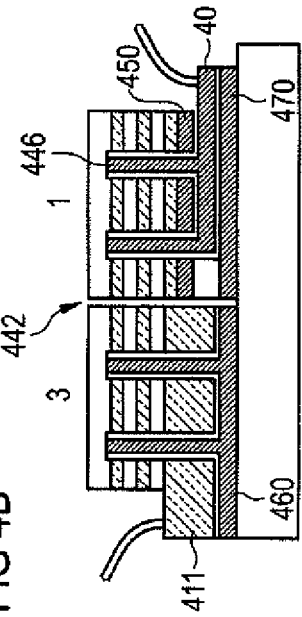
Figure 4D:
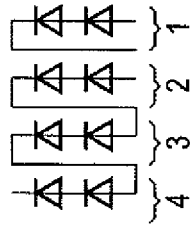
FIGS. 4C, 4D show an equivalent circuit of the embodiments in FIGS. 4A, 4B, FIGS. 4E, 4F show plan views of an optoelectronic semiconductor body, subdivided into a plurality of subsegments corresponding to the section illustrations and the equivalent circuits in FIGS. 4A to 4D.
Figure 4F:
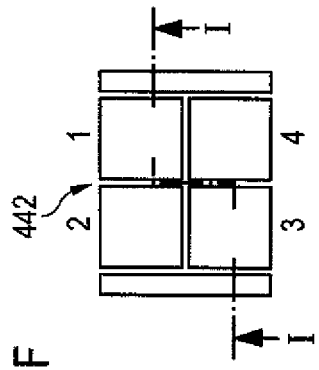
Figure 4A:
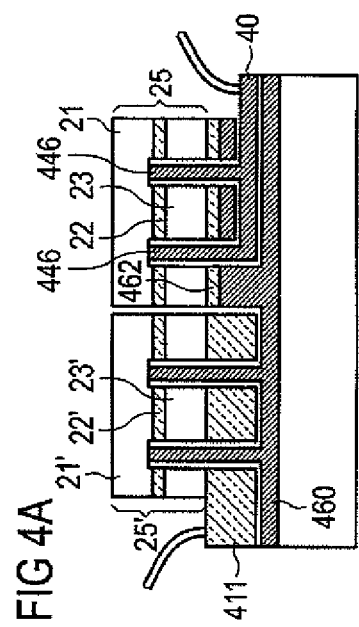
Figure 4C:
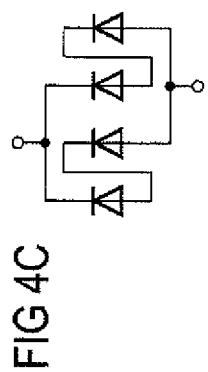
Figure 4E:
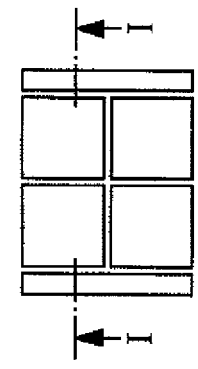

FIG. 4A shows a section illustration through an optoelectronic semiconductor body along the direction shown in FIG. 4E. Contact is in each case made in the edge area through the contact elements 40 and 411. The contact element 40 is electrically conductively connected to the apertures 446, which make contact with the sublayer 21 in the semiconductor layer sequence 20. A pn-junction 22 is formed between the two differently doped sublayers 21 and 23, in which junction the charge carriers injected during operation recombine, and emit electromagnetic radiation. Furthermore, a lateral current distribution layer 462 is arranged on the layer 23, composed of the same material as the contact layer 411 in the second subsegment of the semiconductor body.

A second connecting layer 460 makes contact with the current distribution layer 462 in the right-hand subsegment of the optoelectronic semiconductor body, and forms the aperture contact for the layer 21' of the semiconductor layer sequence in the left-hand subsegment of the optoelectronic semiconductor body. Correspondingly, the second connecting layer 410 is connected to the second layer 23' in the semiconductor layer sequence 20'.

As illustrated in the section FIG. 4A and in the plan view in FIG. 4E, an isolating trench is provided between the left-hand and right-hand subsegments of the optoelectronic semiconductor body. The subsegments are thus electrically isolated from one another. In the equivalent circuit shown in FIG. 4C, two diodes are therefore in each case connected in series. The diode effect in this case results from the illustrated pn-junction in the semiconductor layer sequence 20 or 20'.

FIG. 4B shows an alternative refinement, in which a plurality of pn-junctions are provided, instead of a single pn-junction. These junctions act like two series-connected diodes, as can be seen from the equivalent circuit shown in FIG. 4D.

The section illustration shown in FIG. 4B shows a section along the axes I as in FIG. 4F. In this exemplary embodiment, the optoelectronic semiconductor body is subdivided into four subsegments, which are each separated, with isolation, by a trench 442. The various connecting layers 40, 411, 460 and 450 respectively make contact with the semiconductor layer sequences in the various subsegments, and with the pn-junctions located therein. The connecting layers 40, 411, 450 to 470 are in this case designed such that they connect the four subsegments as explained in the equivalent circuit shown in FIG. 4D.

A series circuit comprising four diodes, in each case comprising two series-connected diodes, is thus provided in the optoelectronic semiconductor body. In consequence, a higher operating voltage is required during operation of the arrangement. The elegant combination of series circuits in the epitaxial layer allows expensive driver stages and high-current sources to be used, since the power levels are now fed on a voltage-operated basis into the optoelectronic semiconductor body, with low current levels. Furthermore, this results in optimized surface-area utilization by the avoidance of absorbing contacts, since all components which produce light can be provided on a single semiconductor body, thus saving current. Furthermore, a series circuit of chips can also be implemented with only one top contact and one conductive mount.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A monolithic, optoelectronic semiconductor body, comprising:
a semiconductor layer sequence which is subdivided into at least two subsegments which are electrically isolated from one another and which semiconductor layer sequence has a first and a second main face, wherein the semiconductor layer sequence in each subsegment has an active layer configured to produce electromagnetic radiation, wherein the first main face of the semiconductor layer sequence is adapted to emit electromagnetic radiation produced in the active layer;
a first contact pad, a second contact pad, and at least one third contact pad;
a first line level, which is arranged adjacent to the second main face and makes electrical contact with a first of the at least two subsegments and with the first contact pad;
a second line level, which is arranged adjacent to the second main face and makes electrical contact with a second of the at least two subsegments and with the second contact pad;
a third line level, which is arranged adjacent to the second main face, electrically connects the first and the second subsegments to one another to produce electromagnetic radiation, and makes electrical contact with the third contact pad; and
a mount substrate adjacent to the second main face,
wherein the first line level, the second line level, and the third line level are arranged at least between the semiconductor layer sequence and the mount substrate,
wherein at least one of the first line level, the second line level, and the third line level and another of the first line level, the second line level, and the third line level overlap.

2. The monolithic, optoelectronic semiconductor body as claimed in claim 1,
wherein the first subsegment comprises a first sublayer and a second sublayer, which is separated by the active layer,
wherein the second of the at least two subsegments has a first sublayer and a second sublayer which is separated by the active layer, and
wherein the third line level makes contact with the first sublayer of the first subsegment and with the second sublayer of the second subsegment.

3. The monolithic, optoelectronic semiconductor body as claimed in claim 2, wherein at least one of the two subsegments has an aperture, which runs through the active layer of the respective subsegment and makes contact with that sublayer of the subsegment which faces the first main face.

4. The monolithic, optoelectronic semiconductor body as claimed in claim 1, wherein at least one contact pad of the first, second and third contact pads is arranged on that face of the semiconductor layer sequence which faces away from the first main face.

5. The monolithic, optoelectronic semiconductor body as claimed in claim 1, further comprising:
an outer area, which is electrically isolated from the at least two subsegments, is arranged adjacent to at least one of the at least two subsegments and
wherein at least one of the first contact pad, the second contact pad, and third contact pad is arranged on a face which faces the first main face.

6. The monolithic, optoelectronic semiconductor body as claimed in claim 1, wherein at least one of the first, second and third line levels comprises a mirror layer which reflects electromagnetic radiation produced in the active layer in the direction of the first main face.

7. The monolithic, optoelectronic semiconductor body as claimed in claim 1, wherein a mirror layer is arranged between the layer sequence and at least one of the first, second and third line levels, in order to reflect electromagnetic radiation produced in the active layer in the direction of the first main face.

8. The monolithic, optoelectronic semiconductor body as claimed in claim 7, wherein the mirror layer is electrically isolated from the active layer of the first and/or at least one second subsegment, and from the at least one line level.

9. The monolithic, optoelectronic semiconductor body as claimed in claim 7, wherein the mirror layer has a plurality of openings, and the at least one line level runs or run through the openings.

10. The monolithic, optoelectronic semiconductor body as claimed in claim 6, wherein the mirror layer covers 50% or more of the second main face of the semiconductor layer sequence.

11. A method for producing a monolithic, optoelectronic semiconductor body, comprising:
epitaxial growth of a semiconductor layer sequence on a growth substrate, wherein the semiconductor layer sequence has an active layer which is suitable for producing electromagnetic radiation;
definition of a first subsegment and of at least one second subsegment, which is electrically isolated therefrom, of the semiconductor layer sequence, which are configured to emit electromagnetic radiation in the direction of a first main face;
formation of a first line level on a face of the semiconductor layer sequence which faces away from the first main face, and making contact with the active layer of the first subsegment;
formation of a second line level on the face of the semiconductor layer sequence which faces away from the first main face, and making contact with the active layer of the at least one second subsegment;
formation of at least one third line level on the face of the semiconductor layer sequence which faces away from the first main face, and making contact with the active layer of the first subsegment and with the active layer of the at least one second subsegment, wherein the third line level couples the active layers of the at least two subsegments to one another, forming a series circuit;
formation of a first contact pad which is connected to the first line level;
formation of a second contact pad which is connected to the second line level; formation of at least one third contact pad which is connected to the at least one third line level; and
arranging a mount substrate adjacent to the second main face,
wherein the first line level, the second line level, and the third line level are arranged at least between the semiconductor layer sequence and the mount substrate,
wherein at least one of the first line level, the second line level, and the third line level and another of the first line level, the second line level, and the third line level overlap.

12. The method as claimed in claim 11, wherein epitaxial growth comprises application of a mirror layer to a face of the semiconductor layer sequence which faces away from the first main face.

13. The method as claimed in claim 11, wherein the epitaxial growth comprises:
provision of a growth substrate;
epitaxial growth of a first sublayer of a first dopant type; and
epitaxial growth of a second sublayer of a second dopant type on the first sublayer, such that the active layer is formed between the first and the second sublayers.

14. The method as claimed in claim 11, wherein the formation of at least one of the first, second and at least one third line levels comprises application of an insulating material and subsequent structuring of the applied insulating material.

* * * * *